(12) United States Patent
He et al.

(10) Patent No.: US 12,297,527 B2
(45) Date of Patent: May 13, 2025

(54) P-TYPE GALLIUM OXIDE FILM, AND PREPARATION METHOD AND APPLICATION THEREOF

(71) Applicant: Hubei University, Wuhan (CN)

(72) Inventors: Yunbin He, Wuhan (CN); Zhouyang Luo, Wuhan (CN); Daotian Shi, Wuhan (CN); Yinmei Lu, Wuhan (CN); Mingkai Li, Wuhan (CN); Jian Chen, Wuhan (CN); Lufeng Chen, Wuhan (CN)

(73) Assignee: Hubei University, Wuhan (CN)

( * ) Notice: Subject to any disclaimer, the term of this patent is extended or adjusted under 35 U.S.C. 154(b) by 0 days.

(21) Appl. No.: 18/811,486

(22) Filed: Aug. 21, 2024

(65) Prior Publication Data

US 2024/0410047 A1 Dec. 12, 2024

(30) Foreign Application Priority Data

Aug. 22, 2023 (CN) .................. 202311060691.X

(51) Int. Cl.
*C23C 14/06* (2006.01)
*C23C 14/02* (2006.01)
(Continued)

(52) U.S. Cl.
CPC ........ *C23C 14/0617* (2013.01); *C23C 14/021* (2013.01); *C23C 14/3414* (2013.01);
(Continued)

(58) Field of Classification Search
CPC .............. C23C 14/0617; C23C 14/021; C23C 14/3414; C23C 14/3435; C23C 14/5806; H01L 31/0321; H01L 31/18
See application file for complete search history.

(56) References Cited

U.S. PATENT DOCUMENTS 4,331,737 A 5/1982 Nishizawa et al.
2009/0118818 A1* 5/2009 Foss .................. A61L 31/14
623/1.42
(Continued)

FOREIGN PATENT DOCUMENTS

CN 111341839 A * 6/2020 ....... H01L 21/02565
KR 20080003509 A 1/2008
WO 2017115209 A1 7/2017

OTHER PUBLICATIONS

CN-111341839-A Translation (Year: 2020).*
(Continued)

*Primary Examiner* — James Lin
*Assistant Examiner* — Patrick S Ott

(57) ABSTRACT

A method for preparing a p-type gallium oxide film is provided. An $M_xGa_{1-x}N$ target material is subjected to ablating, sputtering or evaporation in a vacuum chamber via physical vapor deposition to obtain $M_xGa_{1-x}N$ clusters, where M is selected from the group consisting of Al, Sc, In, Y and Lu, and $0<x<1$. The $M_xGa_{1-x}N$ clusters are oxidized by $O_2$ to obtain M-N co-doped p-type gallium oxide film on a substrate. The $M_xGa_{1-x}N$ target material is prepared from MN powder and GaN powder through ball milling, pressing and sintering. A p-type gallium oxide film prepared by the method, and its application in the manufacturing of solar-blind ultraviolet detection devices and high-power electronic devices are also provided.

11 Claims, 12 Drawing Sheets

(51) Int. Cl.
*C23C 14/34* (2006.01)
*C23C 14/58* (2006.01)
*H10F 71/00* (2025.01)
*H10F 77/12* (2025.01)

(52) U.S. Cl.
CPC ...... *C23C 14/3435* (2013.01); *C23C 14/5806* (2013.01); *H10F 71/00* (2025.01); *H10F 77/12* (2025.01)

(56) References Cited

U.S. PATENT DOCUMENTS

| | | | |
|---|---|---|---|
| 2011/0180392 A1* | 7/2011 | Yano | C04B 35/01 204/298.13 |
| 2012/0152337 A1* | 6/2012 | Aytug | H01L 31/072 257/E31.032 |
| 2013/0206591 A1* | 8/2013 | Takami | C22C 1/101 204/298.13 |
| 2014/0166932 A1* | 6/2014 | Zhou | C23C 14/35 252/301.4 F |
| 2016/0079471 A1* | 3/2016 | Liao | C23C 16/303 438/47 |
| 2018/0323337 A1* | 11/2018 | Dong | H01L 33/32 |
| 2019/0305157 A1* | 10/2019 | Kub | H01L 31/03529 |
| 2021/0305485 A1* | 9/2021 | Morishita | H10N 30/076 |
| 2021/0388526 A1 | 12/2021 | Zhao et al. | |
| 2023/0039342 A1* | 2/2023 | Alfaraj | H01L 31/032 |

OTHER PUBLICATIONS

Drygas, et al, "Novel nanoceramics from in situ made nanocrystalline powders of pure nitrides and their composites in the system aluminum nitride AlN/gallium nitride GaN/aluminum gallium nitride Al0.5Ga0.5N", 2020, Journal of the European Ceramic Society, 40, 5339-5348 (Year: 2020).*

* cited by examiner

P-TYPE GALLIUM OXIDE FILM, AND PREPARATION METHOD AND APPLICATION THEREOF

CROSS-REFERENCE TO RELATED APPLICATIONS

This application claims the benefit of priority from Chinese Patent Application No. 202311060691.X, filed on Aug. 22, 2023. The content of the aforementioned application, including any intervening amendments thereto, is incorporated herein by reference in its entirety.

TECHNICAL FIELD

This application relates to ultra-wide bandgap semiconductor materials and devices, and more specifically to a p-type gallium oxide film, and a preparation method and an application thereof.

BACKGROUND

With the rapid development of new energy, rail transportation, and smart grid, there is an urgent need for semiconductor power devices that can work at high voltage and high power. Gallium oxide ($Ga_2O_3$), as a new ultra-wide bandgap semiconductor material, has a bandgap of 4.85 eV, large breakdown field strength, and excellent thermal stability, which makes it highly suitable for solar-blind ultraviolet detection and preparation of high-power electronic devices. Hence, it has attracted widespread attention.

Significant progress has been made in terms of the research of epitaxial growth, bandgap modulation, and n-type doping of gallium oxide films. However, the p-type doping of gallium oxide is hampered by the low solubility of acceptor dopants, self-trapping of hole carriers, and self-compensation effect of background electrons, and thus the preparation of p-type gallium oxide thin films is still a big challenge. It is necessary to solve the bipolar doping to realize the large-scale application of gallium oxide films. In recent years, given that the N element is close to the O element in atomic size, and the N element (as acceptor impurity) in gallium oxide has a lower activation energy, the N element is widely considered as the most promising p-type dopant in gallium oxide. However, the nitrogen acceptor has poor stability and low solubility in gallium oxide, which renders the preparation of N-doped p-type gallium oxide film difficult and the prepared gallium oxide film less stable.

SUMMARY

In view of this, objectives of the present disclosure are to provide a p-type gallium oxide film, and a preparation method and an application thereof. The solubility and stability of N acceptors are improved, such that the N element substitutes the O element (No) to produce hole carriers, thereby preparing the p-type gallium oxide film.

In a first aspect, this application provides a method for preparing a p-type gallium oxide film, comprising:
preparing a $M_xGa_{1-x}N$ target material, wherein the M is selected from the group consisting of Al, Sc, In, Y and Lu; and 0<x<1;
preparing a substrate; and
placing the substrate in a vacuum chamber of a deposition apparatus; with the $M_xGa_{1-x}N$ target material as nitrogen source and gallium source, subjecting the $M_xGa_{1-x}N$ target material to ablation, sputtering or thermal evaporation by physical vapor deposition to obtain $M_xGa_{1-x}N$ clusters; and oxidizing the $M_xGa_{1-x}N$ clusters with oxygen to grow a N-doped p-type gallium oxide film on the substrate.

In an embodiment, the substrate is placed in the vacuum chamber of the deposition apparatus, and heated to 400-750° C.

In an embodiment, the physical vapor deposition method is performed by sputtering, pulsed laser deposition, or molecular beam epitaxy; and/or the substrate is selected from the group consisting of a c-plane sapphire substrate, a magnesium oxide substrate, a gallium oxide substrate, a gallium nitride substrate, a silicon substrate, a Nb-doped $SrTiO_3$ (NSTO) substrate, a quartz glass substrate, an r-plane sapphire substrate and an a-plane sapphire substrate.

In an embodiment, the $M_xGa_{1-x}N$ target material is ablated by the pulsed laser deposition to obtain the $M_xGa_{1-x}N$ clusters, during which the oxygen is fed into the vacuum chamber for growth of the N-doped p-type gallium oxide film, wherein a pressure of the oxygen in the vacuum chamber is adjusted to be 0-5 Pa; a pulsed laser energy is 120-600 mJ; the number of pulses is 6,000-72,000; and a pulse frequency is 1-20 Hz.

In an embodiment, $0.001 \leq x \leq 0.999$.

In an embodiment, the $M_xGa_{1-x}N$ target material is prepared through steps of:
mixing an MN powder and a GaN powder in a preset proportion by ball milling to obtain a mixed powder;
pressing the mixed powder into a ceramic disk; and
sintering the ceramic disk at 800-1200° C. to obtain the $M_xGa_{1-x}N$ target material.

In an embodiment, the mixed powder is pressed at 2-10 MPa to form the ceramic disk with a thickness of 2-5 mm; and the ceramic disk is sintered at 800-1200° C. for 2-5 h to obtain the $M_xGa_{1-x}N$ target material.

In an embodiment, the method further comprises:
before placing the substrate in the vacuum chamber of the deposition apparatus, rinsing the substrate with acetone, anhydrous ethanol, and deionized water in sequence.

In a second aspect, this application provides a p-type gallium oxide film prepared by the aforementioned method.

In a third aspect, this application provides a solar-blind ultraviolet detection device, comprising:
the aforementioned p-type gallium oxide film.

In a fourth aspect, this application provides a high-power electronic device, comprising:
the aforementioned p-type gallium oxide film.

Compared with the prior art, the present disclosure has at least the following advantages.

In the method provided herein for preparing the p-type gallium oxide film, a $M_xGa_{1-x}N$ target material (e.g., an $Al_xGa_{1-x}N$ or a $Sc_xGa_{1-x}N$ target material) is subjected to ablating, sputtering or thermal evaporation in a vacuum chamber by physical vapor deposition to obtain $M_xGa_{1-x}N$ clusters (e.g., $Al_xGa_{1-x}N$ or $Sc_xGa_{1-x}N$ clusters), and at the same time, $O_2$ is introduced to oxidize the $M_xGa_{1-x}N$ clusters to obtain a M-N co-doped $Ga_2O_3$ film (e.g., Al—N or Sc—N co-doped $Ga_2O_3$ film). By adjusting the oxygen pressure for oxidizing the $M_xGa_{1-x}N$ clusters (e.g., $Al_xGa_{1-x}N$ or $Sc_xGa_{1-x}N$ clusters), i.e., by optimizing the content of N in M-$Ga_2O_3$ (e.g., Al—$Ga_2O_3$ or Sc—$Ga_2O_3$) and the amount of N for substituting O, the p-type M-N co-doped $Ga_2O_3$ film (e.g., Al—N or Sc—N co-doped $Ga_2O_3$ film) is obtained. In the method provided in the present disclosure, the small $M_xGa_{1-x}N$ clusters (such as $Al_xGa_{1-x}N$ or $Sc_xGa_{1-x}N$ clusters) are oxidized to obtain M (e.g., Al or Sc)—N co-doped $Ga_2O_3$, where N substitutes O to generate holes, forming the p-type conductive gallium oxide film. The doping of elements (such as Al or Sc) equivalent to Ga, i.e., alloying, increases both the conduction band minimum (CBM) and the valence band maximum (VBM) of the gallium oxide, which inhibits the ionization of the oxygen vacancies (i.e., reducing the concentration of background electrons) while reducing the activation energy of the N acceptors (improving the generation efficiency of hole carriers via N ionization). Moreover, the solubility of the N acceptors in the gallium oxide film (i.e., increasing the concentration of No hole carriers) and the stability of the N acceptors are effectively improved. The Al—N or Sc—N co-doped p-type gallium oxide film prepared by the method of the present disclosure is a high-quality epitaxial film with a high hole carrier concentration, a low resistivity, and a high p-type conduction stability. Moreover, the involved equipment is readily available, and the preparation process has simple operation and low cost, which will promote the application of gallium oxide in ultra-wide bandgap semiconductor devices.

BRIEF DESCRIPTION OF THE DRAWINGS

To more clearly illustrate the technical solutions in the embodiments of the present disclosure or in the prior art, the required accompanying drawings in the description of the embodiments of the disclosure or in the prior art will be briefly described below. Obviously, the accompanying drawings only show some of the embodiments of the present disclosure, and other accompanying drawings may be obtained by one of ordinary skill in the art based on these drawings without creative effort.

DETAILED DESCRIPTION OF EMBODIMENTS

Figure 1:
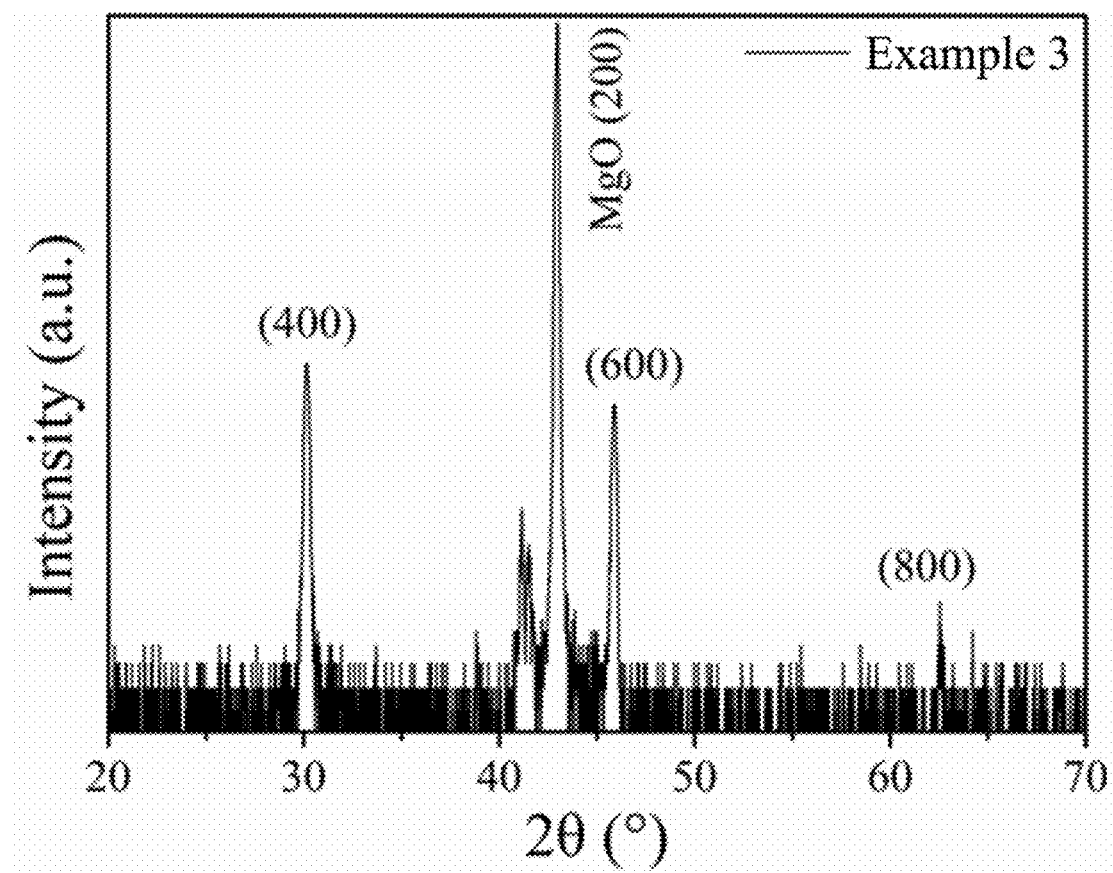
FIG. 1 is an X-ray diffraction (XRD) pattern of an Al—N co-doped p-type gallium oxide thin film prepared in Example 3 of the present disclosure.

The technical solutions of the present disclosure will be described clearly and completely below with reference to the embodiments. Obviously, described herein are merely some embodiments of the present disclosure, instead of all embodiments. Based on these embodiments, all other embodiments obtained by one of ordinary skill in the art without making creative effort shall fall within the scope of the present disclosure.

It should be noted that the description order of the following embodiments does not serve as a limitation of the preferred order of embodiments. Furthermore, in the description of the present application, the term "including" means "including but not limited to". Various embodiments of the present disclosure may exist in the form of a range. It should be understood that the description in the form of a range is merely for convenience and brevity, and should not be construed as a rigid limitation to the scope of the present disclosure. Therefore, the described range should be considered to specifically disclose all possible sub-ranges and any single value within the range. For example, the range from 1 to 6 should be considered to specifically disclose sub-ranges, such as from 1 to 3, from 1 to 4, from 1 to 5, from 2 to 4, from 2 to 6, from 3 to 6, and so forth, as well as a single number within such range, such as 1, 2, 3, 4, 5, and 6. In addition, the numerical range indicated herein is intended to include any quoted number (fraction or integer) within the indicated range.

This application provides a method for preparing a p-type gallium oxide thin film, which includes the following steps.

(S1) A $M_xGa_{1-x}N$ target material is prepared, where the M is selected from the group consisting of Al, Sc, In, Y and Lu; and $0<x<1$.

(S2) A substrate is prepared.

(S3) The substrate is placed in a vacuum chamber of a deposition apparatus. The $M_xGa_{1-x}N$ target material, as nitrogen source and gallium source, is ablated, sputtered or evaporated by physical vapor deposition to obtain $M_xGa_{1-x}N$ clusters. The $M_xGa_{1-x}N$ clusters are oxidized with oxygen for growth of a N-doped p-type gallium oxide film on the substrate.

It should be noted that in the preparation method provided in the present disclosure, a $M_xGa_{1-x}N$ target material is utilized, where M is selected from the group consisting of Al, Sc, In, Y and Lu, and $0<x<1$. Specifically, the $M_xGa_{1-x}N$ target material can be $Al_xGa_{1-x}N$, $Sc_xGa_{1-x}N$, $In_xGa_{1-x}N$, $Y_xGa_{1-x}N$, or $Lu_xGa_{1-x}N$. The doping of an element (such as Al or Sc) equivalent to Ga, i.e., alloying, increases both the conduction band minimum (CBM) and the valence band maximum (VBM) of the gallium oxide, which inhibits the ionization of oxygen vacancies (reducing the concentration of background electrons) while reducing the activation energy of the N acceptors (improving the generation efficiency of hole carriers via N ionization). Moreover, the dual-element co-doping effectively improves the solubility of the N acceptors in the gallium oxide film (increasing the concentration of No hole carriers) and the stability of the N acceptors. In the present disclosure, Al or Sc, equivalent to Ga, is adopted in the alloying of $Ga_2O_3$, and similarly, other elements equivalent to Ga (such as In, Y, and Lu), or elements equivalent to O (such as S, Se and Te) can also be employed in the co-doping with N to obtain the p-type $Ga_2O_3$. Specifically, the elemental powder or a compound of S, Se, and Te, which are equivalent to the element O, is doped into the target material, which is then grown in oxygen to obtain N—S co-doped gallium oxide, N—Se co-doped gallium oxide, and N—Te co-doped gallium oxide, respectively. For example, sulfur powder or gallium sulfide is added into GaN powder to obtain Ga—N—S target material, which is then grown in oxygen to obtain nitrogen-sulfur co-doped gallium oxide thin film. N—Se co-doped gallium oxide and N—Te co-doped gallium oxide can be obtained in a similar way. In the p-type gallium oxide film preparation method provided herein, a $M_xGa_{1-x}N$ target material (e.g., an $Al_xGa_{1-x}N$ or a $Sc_xGa_{1-x}N$ target material) is subjected to ablating, sputtering or thermal evaporation in a vacuum chamber by physical vapor deposition to obtain $M_xGa_{1-x}N$ clusters (e.g., $Al_xGa_{1-x}N$ or $Sc_xGa_{1-x}N$ clusters), and at the same time, $O_2$ is fed to oxidize the $M_xGa_{1-x}N$ clusters to obtain a M-N co-doped $Ga_2O_3$ film (e.g., Al—N or Sc—N co-doped $Ga_2O_3$ film). By adjusting the oxygen pressure for oxidizing the $M_xGa_{1-x}N$ clusters (e.g., $Al_xGa_{1-x}N$ or $Sc_xGa_{1-x}N$ clusters), i.e., by optimizing the content of N in M-$Ga_2O_3$ (e.g., Al—$Ga_2O_3$ or Sc—$Ga_2O_3$) and the amount of N for substituting O, a p-type M-N co-doped $Ga_2O_3$ film (e.g., Al—N or Sc—N co-doped $Ga_2O_3$ film) is obtained. In the method provided in the present disclosure, the small $M_xGa_{1-x}N$ clusters (such as $Al_xGa_{1-x}N$ or $Sc_xGa_{1-x}N$ clusters) are oxidized to obtain M (e.g., Al or Sc)—N co-doped gallium oxide, where N substitutes O to generate hole carriers, forming the p-type conductive gallium oxide thin film. Equivalent elements (such as Al or Sc) doping, i.e., alloying, increases both the conduction band minimum and the valence band maximum of the gallium oxide, which inhibits the ionization of the oxygen vacancies while reducing the activation energy of the N acceptors. Moreover, the solubility of the N acceptors in the gallium oxide film and the stability of the N acceptors are effectively improved.

In some embodiments, the substrate is placed in the vacuum chamber of the deposition apparatus and heated to 400-750° C. The $M_xGa_{1-x}N$ target material, as a nitrogen source and a gallium source, is subjected to ablation, sputtering or thermal evaporation by physical vapor deposition to obtain $M_xGa_{1-x}N$ clusters, and at the same time, $O_2$ is fed into the vacuum chamber to oxide the $M_xGa_{1-x}N$ clusters to grow a N-doped p-type gallium oxide film on the substrate.

In some embodiments, the physical vapor deposition method is magnetron sputtering, pulsed laser deposition, or molecular beam epitaxy.

In some embodiments, the substrate is selected from the group consisting of a c-plane sapphire substrate, a magnesium oxide substrate, a gallium oxide substrate, a gallium nitride substrate, a silicon substrate, a Nb-doped $SrTiO_3$ (NSTO) substrate, a quartz glass substrate, an r-plane sapphire substrate and an a-plane sapphire substrate.

In some embodiments, the $M_xGa_{1-x}N$ target material is ablated by the pulsed laser deposition to obtain the $M_xGa_{1-x}N$ clusters, during which the oxygen is fed into the vacuum chamber for the growth of the N-doped p-type gallium oxide film, where a pressure of the oxygen is adjusted to be 0-5 Pa; a pulsed laser energy is 120-600 mJ; the number of pulses is 6,000-72,000; and a pulse frequency is 1-20 Hz.

In some embodiments, $0.001 \le x \le 0.999$.

In some embodiments, the $M_xGa_{1-x}N$ target material is prepared through the following steps.

An MN (e.g., AlN or ScN) powder and a GaN powder are mixed in a preset proportion by ball milling to obtain a mixed powder.

The mixed powder is pressed into a ceramic disk.

The ceramic disk is sintered at 800-1200° C. to obtain the $M_xGa_{1-x}N$ target.

In some embodiments, the mixed powder is pressed under 2-10 MPa to form the ceramic disk with a thickness of 2-5 mm, and the ceramic disk is sintered at 800-1200° C. for 2-5 h to obtain the $M_xGa_{1-x}N$ target material.

Specifically, the MN (e.g., AlN or ScN) powder and the GaN powder are fed to a ball miller in a preset proportion, to which deionized water (55-65% of the total weight of the powder) is added for ball milling for 6-10 h, followed by drying in a vacuum dryer at 100-130° C. for 6-12 h to obtained dried powder as the mixed powder. Anhydrous ethanol (1-5% of the total weight of the fine powder) is added into the mixed powder, grind for uniform mixing, and pressed at 2-10 MPa to obtain a ceramic disk with a thickness of 2-5 mm. The ceramic disk is sintered at 800-1200° C. for 2-5 h to obtain the $M_xGa_{1-x}N$ target material.

It should be understood that a molar ratio of the MN (e.g., AlN or ScN) powder to the GaN powder is x:(1-x).

In some embodiments, the method also includes: rinsing the substrate with acetone, anhydrous ethanol, and deionized water in sequence before placing the substrate in the vacuum chamber of the deposition apparatus.

It should also be noted that the p-type N-doped gallium oxide thin films and preparation methods thereof in the prior art have problems of poor p-type conductivity stability and low hole-carrier concentration (lower than $10^{17}/cm^3$), so it is necessary to improve and optimize the methods in the prior art. In the method provided by the present disclosure, the doping of equivalent elements, i.e., alloying, increases both the conduction band minimum (CBM) and the valence band maximum (VBM) of the gallium oxide, which inhibits the ionization of the oxygen vacancies (i.e., reducing the concentration of background electrons) while reducing the activation energy of the N acceptors (improving the generation efficiency of hole carriers via N ionization). Moreover, the solubility of the N acceptors in the gallium oxide film (i.e., increasing the concentration of No hole carriers) and the stability of the N acceptors are effectively improved. N substitutes O (No) to generate holes, forming the p-type conductive gallium oxide thin film. The M (e.g., Al or Sc)—N co-doped p-type gallium oxide thin film obtained by the method of the present disclosure is a high-quality epitaxial film with a visible light transmittance of more than 90%, a high concentration of hole carriers ($7.79 \times 10^{17}/cm^3$), and a good conductive stability (p-type conductivity remains after 50 days). The method provided by the present disclosure utilizes physical vapor deposition to obtain $M_xGa_{1-x}N$ clusters (e.g., $Al_xGa_{1-x}N$ or $Sc_xGa_{1-x}N$ clusters), and the $M_xGa_{1-x}N$ clusters are oxidized through $O_2$. In this case, the solubility of N element in the $Ga_2O_3$ thin film is effectively increased, and N substitutes O (No) to generate holes, forming the p-type conductive gallium oxide thin film. The alloying of equivalent elements (such as Al or Sc) increases both the conduction band minimum (CBM) and the valence band maximum (VBM) of the gallium oxide, which inhibits the ionization of the oxygen vacancies while reducing the activation energy of the N acceptors, and effectively improves the solubility of the N acceptors in the gallium oxide film and the stability of the N acceptors. The Al—N or Sc—N co-doped p-type gallium oxide film prepared by the method of the present disclosure has a high hole carrier concentration, a low resistivity, and a high stability. Moreover, the film has a high crystal quality, and the equipment and preparation process required by the method prepared herein is simple and low in production cost, which will promote the application of gallium oxide in ultra-wide bandgap semiconductor devices.

Based on the same inventive concept, the present disclosure also provides a p-type gallium oxide thin film prepared by the above-mentioned method.

Based on the same inventive concept, the present disclosure also provides a solar-blind ultraviolet detection device including the aforementioned p-type gallium oxide thin film, and a high-power electronic device including the aforementioned p-type gallium oxide thin film.

The preparation method and application of the p-type gallium oxide thin film of the present disclosure will be described with reference to the following embodiments. The following embodiments are merely illustrative, and should not be construed as a limitation of the present disclosure. Unless otherwise specifically stated, the technical approaches used in the embodiments are conventional and known to one of ordinary skill in the art. Unless otherwise specifically stated, the reagents, methods and apparatuses used in the present disclosure are conventional in the art.

Example 1

Provided herein was a method for preparing an Al—N co-doped p-type gallium oxide thin film, which included the following steps.

(S1) An $Al_{0.01}Ga_{0.99}N$ target material was prepared.

(S2) A MgO substrate was provided.

(S3) The MgO substrate was rinsed successively with acetone and anhydrous ethanol for 15 min, dried with high-purity nitrogen, and transferred to a vacuum chamber of a pulsed laser deposition system, and the vacuum chamber was vacuumized to $1\times10^{-4}$ Pa. The MgO substrate was heated to 500° C., and oxygen was fed into the vacuum chamber as growth atmosphere, where an oxygen pressure was adjusted to be 1 Pa. The $Al_{0.01}Ga_{0.99}N$ target material was used as Al—N source and Ga source, and subjected to pulsed laser ablation to grow the Al—N co-doped p-type gallium oxide thin film on the MgO substrate, where the film had a thickness of about 150 nm, the pulsed laser energy was 300 mJ, the number of pulses was 18000, and the pulse frequency was 5 Hz.

The $Al_{0.01}Ga_{0.99}N$ target material was prepared through the following steps.

AlN powder and GaN powder were mixed according to a molar ratio of 0.01:0.99, placed in a ball miller, and then added with deionized water (60% of the total weight of the mixed powder) for ball milling for 8 h to obtain a powder mixture. The powder mixture was dried in a vacuum drying oven at 120° C. for 8 h to obtain fine powder.

The fine powder was added with anhydrous ethanol (3% of the total weight of the fine powder), ground for uniform mixing, and pressed with a tablet press at 4 MPa to form an $Al_{0.01}Ga_{0.99}N$ ceramic disk with a thickness of 3 mm.

The $Al_{0.01}Ga_{0.99}N$ ceramic disk was sintered in a vacuum tube furnace at 950° C. for 6 h to obtain the $Al_{0.01}Ga_{0.99}N$ target material.

In this example, the $Al_{0.01}Ga_{0.99}N$ target material was ablated by pulsed laser to obtain $Al_{0.01}Ga_{0.99}N$ clusters, which were oxidized with $O_2$ to form the Al—N co-doped p-type gallium oxide thin film. The method provided herein effectively increased the solubility of N element in the gallium oxide thin film, and N element substituted O element to generate hole carriers, thereby forming the p-type conductive gallium oxide thin film. The Al-doping-based alloying increased both the conduction band minimum (CBM) and the valence band maximum (VBM) of the gallium oxide, thereby inhibiting the ionization of the oxygen vacancies while reducing the activation energy of the N acceptors. Moreover, the solubility of the N acceptors in the gallium oxide film and the stability of the N acceptors were effectively improved.

Example 2

Provided herein was a method for preparing an Al—N co-doped p-type gallium oxide thin film, which included the following steps.

(S1) An $Al_{0.01}Ga_{0.99}N$ target material was prepared.

(S2) A MgO substrate was provided.

(S3) The MgO substrate was rinsed successively with acetone and anhydrous ethanol for 15 min, dried with high-purity nitrogen, and transferred to a vacuum chamber of a pulsed laser deposition system, and the vacuum chamber was vacuumized to $1\times10^{-4}$ Pa. The MgO substrate was heated up to 550° C., and oxygen was fed into the vacuum chamber as growth atmosphere, where an oxygen pressure was adjusted to be 1 Pa. The $Al_{0.01}Ga_{0.99}N$ target material was used as Al—N source and Ga source, and subjected to pulsed laser ablation to grow the Al—N co-doped p-type gallium oxide thin film on the MgO substrate, where the film had a thickness of about 150 nm; the pulsed laser energy was 300 mJ; the number of pulses was 18,000; and the pulse frequency was 5 Hz.

The $Al_{0.01}Ga_{0.99}N$ target material was prepared through the following steps.

AlN powder and GaN powder were mixed according to a molar ratio of 0.01:0.99, placed in a ball miller, and then added with deionized water (60% of the total weight of the mixed powder) for ball milling for 8 h to obtain a powder mixture. The milled powder mixture was dried in a vacuum drying oven at 120° C. for 8 h to obtain fine powder.

The fine powder was added with anhydrous ethanol (3% of the total weight of the fine powder), ground for uniform mixing, and pressed with a tablet press at 4 MPa to form an $Al_{0.01}Ga_{0.99}N$ ceramic disk with a thickness of 3 mm.

The $Al_{0.01}Ga_{0.99}N$ ceramic disk was sintered in a vacuum tube furnace at 950° C. for 6 h to obtain the $Al_{0.01}Ga_{0.99}N$ target material.

In this example, the $Al_{0.01}Ga_{0.99}N$ target material was ablated by pulsed laser to obtain $Al_{0.01}Ga_{0.99}N$ clusters, which were oxidized with $O_2$ to form the Al—N co-doped p-type gallium oxide thin film. The method provided herein effectively increased the solubility of N element in the gallium oxide thin film, and N element substituted O element to generate hole carriers, thereby forming the p-type conductive gallium oxide thin film. The Al-doping-based alloying increased both the conduction band minimum (CBM) and the valence band maximum (VBM) of the gallium oxide, thereby inhibiting the ionization of the oxygen vacancies while reducing the activation energy of the N acceptors. Moreover, the solubility of the N acceptors in the gallium oxide film and the stability of the N acceptors were effectively improved.

Example 3

Provided herein was a method for preparing an Al—N co-doped p-type gallium oxide thin film, which included the following steps.

(S1) An $Al_{0.01}Ga_{0.99}N$ target material was prepared.

(S2) A MgO substrate was provided.

(S3) The MgO substrate was rinsed successively with acetone and anhydrous ethanol for 15 min, and dried with high-purity nitrogen, and transferred to a vacuum chamber of a pulsed laser deposition system, and the vacuum chamber was vacuumized to $1 \times 10^{-4}$ Pa. The MgO substrate was heated up to 600° C., and oxygen was fed into the vacuum chamber as growth atmosphere, where an oxygen pressure was adjusted to be 1 Pa. The $Al_{0.01}Ga_{0.99}N$ target material was used as Al—N source and Ga source, and subjected to pulsed laser ablation to grow the Al—N co-doped p-type gallium oxide thin film on the MgO substrate, where the film had a thickness of about 150 nm; the pulsed laser energy was 300 mJ; the number of pulses was 18,000; and the pulse frequency was 5 Hz.

The $Al_{0.01}Ga_{0.99}N$ target material was prepared through the following steps.

AlN powder and GaN powder were mixed according to a molar ratio of 0.01:0.99, placed in a ball miller, and then added with deionized water (60% of the total weight of the mixed powder) for ball milling for 8 h to obtain milled powder mixture. The milled powder mixture was dried in a vacuum drying oven for drying at 120° C. for 8 h to obtain fine powder.

The fine powder was added with anhydrous ethanol (3% of the total weight of the fine powder), ground for uniform mixing, and pressed with a tablet press at 4 MPa to form an $Al_{0.01}Ga_{0.99}N$ ceramic disk with a thickness of 3 mm.

The $Al_{0.01}Ga_{0.99}N$ ceramic disk was sintered in a vacuum tube furnace at 950° C. for 6 h to obtain the $Al_{0.01}Ga_{0.99}N$ target material.

In this example, the $Al_{0.01}Ga_{0.99}N$ target material was ablated by pulsed laser to obtain $Al_{0.01}Ga_{0.99}N$ clusters, which were oxidized with $O_2$ to form the Al—N co-doped p-type gallium oxide thin film. The method provided herein effectively increased the solubility of N element in the gallium oxide thin film, and N element substituted O element to generate hole carriers, thereby forming the p-type conductive gallium oxide thin film. The Al-doping-based alloying increased both the conduction band minimum (CBM) and the valence band maximum (VBM) of the gallium oxide, thereby inhibiting the ionization of the oxygen vacancies while reducing the activation energy of the N acceptors. Moreover, the solubility of the N acceptors in the gallium oxide film and the stability of the N acceptors were effectively improved.

The structural, optical and electrical properties of the Al—N co-doped p-type gallium oxide thin film prepared in this example were tested, and results were as follows: the preferred growth orientation of the film was (100); the visible light transmittance was 90%; the film had p-type conductivity; the hole concentration was $7.79 \times 10^{17}$ $cm^{-3}$; the hole mobility was 0.072 $cm^2/V \cdot s$; and the resistivity was 112 $\Omega \cdot cm$.

Example 4

Provided herein was a method for preparing an Al—N co-doped p-type gallium oxide thin film, which included the following steps.

(S1) An $Al_{0.01}Ga_{0.99}N$ target material was prepared.

(S2) A MgO substrate was provided.

(S3) The MgO substrate was rinsed successively with acetone and anhydrous ethanol for 15 min, and dried with high-purity nitrogen, and transferred to a vacuum chamber of a pulsed laser deposition system, and the vacuum chamber was vacuumized to $1 \times 10^{-4}$ Pa. The MgO substrate was heated up to 650° C., and oxygen was fed into the vacuum chamber as growth atmosphere, where an oxygen pressure was adjusted to be 1 Pa. The $Al_{0.01}Ga_{0.99}N$ target material was used as Al—N source and Ga source, and subjected to pulsed laser ablation to grow the Al—N co-doped p-type gallium oxide thin film on the MgO substrate, where the film had a thickness of about 150 nm; the pulsed laser energy was 300 mJ; the number of pulses was 18,000; and the pulse frequency was 5 Hz.

The $Al_{0.01}Ga_{0.99}N$ target material was prepared through the following steps.

AlN powder and GaN powder were mixed according to a molar ratio of 0.01:0.99, placed in a ball miller, and then added with deionized water (60% of the total weight of the mixed powder) for ball milling for 8 h to obtain milled powder mixture. The milled powder mixture was dried in a vacuum drying oven for drying at 120° C. for 8 h to obtain fine powder.

The fine powder was added with anhydrous ethanol (3% of the total weight of the fine powder), ground for uniform mixing, and pressed with a tablet press at 4 MPa to form an $Al_{0.01}Ga_{0.99}N$ ceramic disk with a thickness of 3 mm.

The $Al_{0.01}Ga_{0.99}N$ ceramic disk was sintered in a vacuum tube furnace at 950° C. for 6 h to obtain the $Al_{0.01}Ga_{0.99}N$ target material.

In this example, the $Al_{0.01}Ga_{0.99}N$ target material was ablated by pulsed laser to obtain $Al_{0.01}Ga_{0.99}N$ clusters, which were oxidized with $O_2$ to form the Al—N co-doped p-type gallium oxide thin film. The method provided herein effectively increased the solubility of N element in the gallium oxide thin film, and N element substituted O element to generate hole carriers, thereby forming the p-type conductive gallium oxide thin film. The Al-doping-based alloying increased both the conduction band minimum (CBM) and the valence band maximum (VBM) of the gallium oxide, thereby inhibiting the ionization of the oxygen vacancies while reducing the activation energy of the N acceptors. Moreover, the solubility of the N acceptors in the gallium oxide film and the stability of the N acceptors were effectively improved.

The structural, optical and electrical properties of the Al—N co-doped p-type gallium oxide thin film prepared in this example were tested, and results were as follows: the preferred growth orientation of the film was (100); the visible light transmittance was 90%; the film had p-type conductivity; the hole concentration was $7.12 \times 10^{17}$ $cm^{-3}$; the hole mobility was 0.05 $cm^2/V \cdot s$; and the resistivity was 179 $\Omega \cdot cm$.

Example 5

Provided herein was a method for preparing an Al—N co-doped p-type gallium oxide thin film, which included the following steps.

(S1) An $Al_{0.01}Ga_{0.99}N$ target material was prepared.

(S2) A MgO substrate was provided.

(S3) The MgO substrate was rinsed successively with acetone and anhydrous ethanol for 15 min, and dried with high-purity nitrogen, and transferred to a vacuum chamber of a pulsed laser deposition system, and the vacuum chamber was vacuumized to $1\times10^{-4}$ Pa. The MgO substrate was heated up to 700° C., and oxygen was fed into the vacuum chamber as growth atmosphere, where an oxygen pressure was adjusted to be 1 Pa. The $Al_{0.01}Ga_{0.99}N$ target material was used as Al—N source and Ga source, and subjected to pulsed laser ablation to grow the Al—N co-doped p-type gallium oxide thin film on the MgO substrate, where the film had a thickness of about 150 nm; the pulsed laser energy was 300 mJ; the number of pulses was 18,000; and the pulse frequency was 5 Hz.

The $Al_{0.01}Ga_{0.99}N$ target material was prepared through the following steps.

AlN powder and GaN powder were mixed according to a molar ratio of 0.01:0.99, placed in a ball miller, and then added with deionized water (60% of the total weight of the mixed powder) for ball milling for 8 h to obtain milled powder mixture. The milled powder mixture was dried in a vacuum drying oven for drying at 120° C. for 8 h to obtain fine powder.

The fine powder was added with anhydrous ethanol (3% of the total weight of the fine powder), ground for uniform mixing, and pressed with a tablet press at 4 MPa to form an $Al_{0.01}Ga_{0.99}N$ ceramic disk with a thickness of 3 mm.

The $Al_{0.01}Ga_{0.99}N$ ceramic disk was sintered in a vacuum tube furnace at 950° C. for 6 h to obtain the $Al_{0.01}Ga_{0.99}N$ target material.

In this example, the $Al_{0.01}Ga_{0.99}N$ target material was ablated by pulsed laser to obtain $Al_{0.01}Ga_{0.99}N$ clusters, which were oxidized with $O_2$ to form the Al—N co-doped p-type gallium oxide thin film. The method provided herein effectively increased the solubility of N element in the gallium oxide thin film, and N element substituted O element to generate hole carriers, thereby forming the p-type conductive gallium oxide thin film. The Al-doping-based alloying increased both the conduction band minimum (CBM) and the valence band maximum (VBM) of the gallium oxide, thereby inhibiting the ionization of the oxygen vacancies while reducing the activation energy of the N acceptors. Moreover, the solubility of the N acceptors in the gallium oxide film and the stability of the N acceptors were effectively improved.

Example 6

Provided herein was a method for preparing a Sc—N co-doped p-type gallium oxide thin film, which included the following steps.

(S1) A $Sc_{0.01}Ga_{0.99}N$ target material was prepared.

(S2) Ac-plane sapphire substrate was provided.

(S3) The c-plane sapphire substrate was rinsed successively with acetone, anhydrous ethanol, and deionized water for 15 min, dried with high-purity nitrogen, and transferred to a vacuum chamber of a pulsed laser deposition system, and the vacuum chamber was vacuumized to $1\times10^{-4}$ Pa. The c-plane sapphire substrate was heated to 500° C., and oxygen was fed into the vacuum chamber as growth atmosphere, where an oxygen pressure was adjusted to be 1 Pa. The $Sc_{0.01}Ga_{0.99}N$ target material was used as Sc—N source and Ga source, and subjected to pulsed laser ablation to grow the Sc—N co-doped p-type gallium oxide thin film on the c-plane sapphire substrate, where the film had a thickness of about 250 nm, the pulsed laser energy was 300 mJ, the number of pulses was 18,000, and the pulse frequency was 5 Hz.

The $Sc_{0.01}Ga_{0.99}N$ target material was prepared through the following steps.

ScN powder and GaN powder were mixed according to a molar ratio of 0.01:0.99, placed in a ball miller, and then added with deionized water (60% of the total weight of the mixed powder) for ball milling for 8 h to obtain a powder mixture. The powder mixture was dried in a vacuum drying oven at 120° C. for 8 h to obtain fine powder.

The fine powder was added with anhydrous ethanol (3% of the total weight of the fine powder), ground for uniform mixing, and pressed with a tablet press at 4 MPa to form a $Sc_{0.01}Ga_{0.99}N$ ceramic disk with a thickness of 3 mm.

The $Sc_{0.01}Ga_{0.99}N$ ceramic disk was sintered in a vacuum tube furnace at 950° C. for 6 h to obtain the $Sc_{0.01}Ga_{0.99}N$ target material.

In this example, the $Sc_{0.01}Ga_{0.99}N$ target material was ablated by pulsed laser to obtain $Sc_{0.01}Ga_{0.99}N$ clusters, which were oxidized with $O_2$ to form the Sc—N co-doped p-type gallium oxide thin film. The method provided herein effectively increased the solubility of N element in the gallium oxide thin film, and N element replaced O element to generate hole carriers, thereby forming the p-type conductive gallium oxide thin film. Sc-doping-based alloying increased both the conduction band minimum (CBM) and the valence band maximum (VBM) of the gallium oxide, thereby inhibiting the ionization of the oxygen vacancies while reducing the activation energy of the N acceptors, and effectively improved the solubility and the stability of the N acceptors in the gallium oxide film.

The structural, optical and electrical properties of the Sc—N co-doped p-type gallium oxide thin film prepared in this example were tested, and results were as follows: the preferred growth orientation of the film was (−201); the visible light transmittance was 90%; the film had p-type conductivity; the hole concentration was $6.18\times10^{16}$ $cm^{-3}$; the hole mobility was 0.11 $cm^2/V\cdot s$; and the resistivity was 913 $\Omega\cdot cm$.

Example 7

Provided herein was a method for preparing an Sc—N co-doped p-type gallium oxide thin film, which included the following steps.

(S1) A $Sc_{0.01}Ga_{0.99}N$ target material was prepared.

(S2) A c-plane sapphire substrate was provided.

(S3) The c-plane sapphire substrate was rinsed successively with acetone, anhydrous ethanol, and deionized water for 15 min, and dried with high-purity nitrogen, and transferred to a vacuum chamber of a pulsed laser deposition system, and the vacuum chamber was vacuumized to $1\times10^{-4}$ Pa. The c-plane sapphire substrate was heated up to 550° C., and oxygen was fed into the vacuum chamber as growth atmosphere, where an oxygen pressure was adjusted to be 1 Pa. The $Sc_{0.01}Ga_{0.99}N$ target material was used as Sc—N source and Ga source, and subjected to pulsed laser ablation to grow the Sc—N co-doped p-type gallium oxide thin film on the c-plane sapphire substrate, where the film had a thickness of about 250 nm; the pulsed laser energy was 300 mJ, the number of pulses was 18,000; and the pulse frequency was 5 Hz.

The $Sc_{0.01}Ga_{0.99}N$ target material was prepared through the following steps.

ScN powder and GaN powder were mixed according to a molar ratio of 0.01:0.99, placed in a ball miller, and then added with deionized water (60% of the total weight of the mixed powder) for ball milling for 8 h to obtain a powder mixture. The powder mixture was dried in a vacuum drying oven at 120° C. for 8 h to obtain fine powder.

The fine powder was added with anhydrous ethanol (3% of the total weight of the fine powder), ground for uniform mixing, and pressed with a tablet press at 4 MPa to form a $Sc_{0.01}Ga_{0.99}N$ ceramic disk with a thickness of 3 mm.

The $Sc_{0.01}Ga_{0.99}N$ ceramic disk was sintered in a vacuum tube furnace at 950° C. for 6 h to obtain the $Sc_{0.01}Ga_{0.99}N$ target material.

In this example, the $Sc_{0.01}Ga_{0.99}N$ target material was ablated by pulsed laser to obtain $Sc_{0.01}Ga_{0.99}N$ clusters, which were oxidized with $O_2$ to form the Sc—N co-doped p-type gallium oxide thin film. The method provided herein effectively increased the solubility of N element in the gallium oxide thin film, and N element replaced O element to generate hole carriers, thereby forming the p-type conductive gallium oxide thin film. Sc-doping-based alloying increased both the conduction band minimum (CBM) and the valence band maximum (VBM) of the gallium oxide, thereby inhibiting the ionization of the oxygen vacancies while reducing the activation energy of the N acceptors, and effectively improved the solubility and stability of the N acceptors in the gallium oxide film.

The structural, optical and electrical properties of the Sc—N co-doped p-type gallium oxide thin film prepared in this example were tested, and results were as follows: the preferred growth orientation of the film was (–201); the visible light transmittance was 90%; the film had p-type conductivity; the hole concentration was $9.56 \times 10^{16}$ $cm^{-3}$; the hole mobility was 0.067 $cm^2/V \cdot s$; and the resistivity was 986 $\Omega \cdot cm$.

Example 8

Provided herein was a method for preparing an Sc—N co-doped p-type gallium oxide thin film, which included the following steps.

(S1) A $Sc_{0.01}Ga_{0.99}N$ target material was prepared.
(S2) A c-plane sapphire substrate was provided.
(S3) The c-plane sapphire substrate was rinsed successively with acetone, anhydrous ethanol, and deionized water for 15 min, dried with high-purity nitrogen, and transferred to a vacuum chamber of a pulsed laser deposition system, and the vacuum chamber was vacuumized to $1 \times 10^{-4}$ Pa. The c-plane sapphire substrate was heated up to 600° C., and oxygen was fed into the vacuum chamber as growth atmosphere, where an oxygen pressure was adjusted to be 1 Pa. The $Sc_{0.01}Ga_{0.99}N$ target material was used as Sc—N source and Ga source, and subjected to pulsed laser ablation to grow the Sc—N co-doped p-type gallium oxide thin film on the c-plane sapphire substrate, where the film had a thickness of about 250 nm; the pulsed laser energy was 300 mJ; the number of pulses was 18,000; and the pulse frequency was 5 Hz.

The $Sc_{0.01}Ga_{0.99}N$ target material was prepared through the following steps.

ScN powder and GaN powder were mixed according to a molar ratio of 0.01:0.99, placed in a ball miller, and then added with deionized water (60% of the total weight of the mixed powder) for ball milling for 8 h to obtain a powder mixture. The powder mixture was dried in a vacuum drying oven at 120° C. for 8 h to obtain fine powder.

The fine powder was added with anhydrous ethanol (3% of the total weight of the fine powder), ground for uniform mixing, and pressed with a tablet press at 4 MPa to form a $Sc_{0.01}Ga_{0.99}N$ ceramic disk with a thickness of 3 mm.

The $Sc_{0.01}Ga_{0.99}N$ ceramic disk was sintered in a vacuum tube furnace at 950° C. for 6 h to obtain the $Sc_{0.01}Ga_{0.99}N$ target material.

In this example, the $Sc_{0.01}Ga_{0.99}N$ target material was ablated by pulsed laser to obtain $Sc_{0.01}Ga_{0.99}N$ clusters, which were oxidized with $O_2$ to form the Sc—N co-doped p-type gallium oxide thin film. The method provided herein effectively increased the solubility of N element in the gallium oxide thin film, and N element replaced O element to generate hole carriers, thereby forming the p-type conductive gallium oxide thin film. Sc-doping-based alloying increased both the conduction band minimum (CBM) and the valence band maximum (VBM) of the gallium oxide, thereby inhibiting the ionization of the oxygen vacancies while reducing the activation energy of the N acceptors, and effectively improved the solubility and stability of the N acceptors in the gallium oxide film.

Example 9

Provided herein was a method for preparing an Sc—N co-doped p-type gallium oxide thin film, which included the following steps.

(S1) A $Sc_{0.01}Ga_{0.99}N$ target material was prepared.
(S2) A c-plane sapphire substrate was provided.
(S3) The c-plane sapphire substrate was rinsed successively with acetone, anhydrous ethanol, and deionized water for 15 min, and dried with high-purity nitrogen, and transferred to a vacuum chamber of a pulsed laser deposition system, and the vacuum chamber was vacuumized to $1 \times 10^{-4}$ Pa. The c-plane sapphire substrate was heated up to 650° C., and oxygen was fed into the vacuum chamber as growth atmosphere, where the oxygen pressure was adjusted to be 1 Pa. The $Sc_{0.01}Ga_{0.99}N$ target material was used as Sc—N source and Ga source, and subjected to pulsed laser ablation to grow the Sc—N co-doped p-type gallium oxide thin film on the c-plane sapphire substrate, where the film had a thickness of about 200 nm; the pulsed laser energy was 300 mJ; the number of pulses was 18,000; and the pulse frequency was 5 Hz.

The $Sc_{0.01}Ga_{0.99}N$ target material was prepared through the following steps.

ScN powder and GaN powder were mixed according to a molar ratio of 0.01:0.99, placed in a ball miller, and then added with deionized water (60% of the total weight of the mixed powder) for ball milling for 8 h to obtain a powder mixture. The milled powder mixture was dried in a vacuum drying oven at 120° C. for 8 h to obtain fine powder.

The fine powder was added with anhydrous ethanol (3% of the total weight of the fine powder), ground for uniform mixing, and pressed with a tablet press at 4 MPa to form a $Sc_{0.01}Ga_{0.99}N$ ceramic disk with a thickness of 3 mm.

The $Sc_{0.01}Ga_{0.99}N$ ceramic disk was sintered in a vacuum tube furnace at 950° C. for 6 h to obtain the $Sc_{0.01}Ga_{0.99}N$ target material.

In this example, the $Sc_{0.01}Ga_{0.99}N$ target material was ablated by pulsed laser to obtain $Sc_{0.01}Ga_{0.99}N$ clusters, which were oxidized with $O_2$ to form the Sc—N co-doped p-type gallium oxide thin film. The method provided herein effectively increased the solubility of N element in the gallium oxide thin film, and N element replaced O element to generate hole carriers, thereby forming the p-type conductive gallium oxide thin film. Sc-doping based alloying increased both the conduction band minimum (CBM) and the valence band maximum (VBM) of the gallium oxide, thereby inhibiting the ionization of the oxygen vacancies while reducing the activation energy of the N acceptor, and effectively improved the solubility and stability of the N acceptors in the gallium oxide film.

Comparative Example 1

Provided herein was a method for preparing a N-doped p-type gallium oxide thin film, which included the following steps.

(S1) A GaN target material was prepared.

(S2) A MgO substrate was provided.

(S3) The MgO substrate was rinsed successively with acetone and anhydrous ethanol for 15 min, dried with high-purity nitrogen, and transferred to a vacuum chamber of a pulsed laser deposition system, and the vacuum chamber was vacuumized to $1\times10^{-4}$ Pa. The MgO substrate was heated to 600° C., and oxygen was fed into the vacuum chamber as growth atmosphere, where an oxygen pressure was adjusted to be 1 Pa. The GaN target material was used as N source and Ga source, and subjected to pulsed laser ablation to grow the N-doped p-type gallium oxide thin film on the MgO substrate, where the film had a thickness of about 120 nm; the pulsed laser energy was 275 mJ; the number of pulses was 18,000; and the pulse frequency was 5 Hz.

The GaN target material was prepared through the following steps.

GaN powder was ball-milled with deionized water (60% of the weight of the GaN powder) in a ball miller for 8 h, and dried in a vacuum drying oven at 120° C. for 8 h to obtain fine powder.

The fine powder was added with anhydrous ethanol (3% of the total weight of the fine powder), ground for uniform mixing, and pressed with a tablet press at 4 MPa to form a GaN ceramic disk with a thickness of 3 mm.

The GaN ceramic disk was sintered in a vacuum tube furnace at 950° C. for 6 h to obtain the GaN target material.

In this example, the GaN target material was ablated by pulsed laser to obtain GaN clusters, which were oxidized with $O_2$ to form the N-doped p-type gallium oxide thin film. The method provided herein effectively increased the solubility of N element in the gallium oxide thin film, and N element replaced O element to generate hole carriers, thereby forming the p-type conductive gallium oxide thin film.

The structural, optical and electrical properties of the N-doped p-type gallium oxide thin film prepared in this example were tested, and results were as follows: the preferential growth orientation of the film was the (100) crystal plane, the visible light transmittance was 90%, the film was p-type conductive, the concentration of hole carriers was $7.03\times10^{16}$ cm$^{-3}$, and the resistivity was 20.9 Ω·cm. The N-doped p-type gallium oxide thin film was tested again after 1 month, and results were as follows: the film was n-type conductive, the concentration of electron carriers was $4.52\times10^{18}$ cm$^{-3}$, and the resistivity was 2.36 Ω·cm. The results showed that the single N-doping could also achieve the preparation of the p-type gallium oxide thin film, but the resultant film had poor p-type conduction stability, and turned into n-type conduction in relatively short period of time.

Comparative Example 2

Provided herein was a method for preparing a solely Sc-doped gallium oxide thin film, which included the following steps.

(S1) A $(Sc_{0.06}Ga_{0.94})_2O_3$ target material was prepared.

(S2) A c-plane sapphire substrate was provided.

(S3) The c-plane sapphire substrate was rinsed successively with acetone, anhydrous ethanol, and deionized water for 15 min, dried with high-purity nitrogen, and transferred to a vacuum chamber of a pulsed laser deposition system, and the vacuum chamber was vacuumized to $1\times10^{-4}$ Pa. The c-plane sapphire substrate was heated up to 700° C., and oxygen was fed into the vacuum chamber as growth atmosphere, where an oxygen pressure was adjusted to be 4 Pa. The $(Sc_{0.06}Ga_{0.94})_2O_3$ target material was used as Sc source and Ga source, and subjected to pulsed laser ablation to grow the Sc-doped gallium oxide thin film on the c-plane sapphire substrate, where the film had a thickness of about 150 nm; the pulsed laser energy was 300 mJ; the number of pulses was 18,000; and the pulse frequency was 5 Hz.

The $(Sc_{0.06}Ga_{0.94})_2O_3$ target material was prepared through the following steps.

$Sc_2O_3$ powder and $Ga_2O_3$ powder were mixed according to a molar ratio of 0.06:0.99, ball-milled with deionized water (60% of the weight of the mixed powder) in a ball miller for 8 h, and dried in a vacuum drying oven at 120° C. for 8 h to obtain fine powder.

The fine powder was added with anhydrous ethanol (3% of the total weight of the fine powder), ground for uniform mixing, and pressed with a tablet press at 4 MPa to form an $(Sc_{0.06}Ga_{0.94})_2O_3$ ceramic disk with a thickness of 3 mm.

The $(Sc_{0.06}Ga_{0.94})_2O_3$ ceramic disk was sintered in a vacuum tube furnace at 1300° C. for 4 h to obtain the $(Sc_{0.06}Ga_{0.94})_2O_3$ target material.

In this example, the $(Sc_{0.06}Ga_{0.94})_2O_3$ target material was ablated by pulsed laser to obtain $(Sc_{0.06}Ga_{0.94})_2O_3$ clusters, which were oxidized with $O_2$ to form the Sc-doped gallium oxide thin film. Sc-doping based alloying increased both the conduction band minimum (CBM) and the valence band maximum (VBM) of the gallium oxide, and the optical bandgap of the film increased to 4.96 eV The introduction of Sc inhibited the ionization of oxygen vacancies in gallium oxide. Electrical tests showed that Sc-doped gallium oxide film was in a high-resistance state.

Performance Tests

The Al—N or Sc—N co-doped p-type gallium oxide thin films prepared in Examples 3, 6 and 7 were tested, and the results were shown in Table 1.

TABLE 1

Properties of the Al—N or Sc—N co-doped p-type gallium oxide thin films prepared in Examples 3, 6 and 7.

| Test items | Example 3 | Example 6 | Example 7 |
|---|---|---|---|
| Temperature (K) | 300 | 300 | 300 |
| Conductive type | p | p | p |
| Hole carrier concentration (1/cm$^3$) | $7.79 \times 10^{17}$ | $6.18 \times 10^{16}$ | $9.56 \times 10^{16}$ |
| Hall mobility (cm$^2$/V · s) | 0.072 | 0.11 | 0.067 |
| Electrical resistivity (Ω · cm) | 112 | 913 | 986 |

TABLE 2

Time dependence of the Al—N co-doped p-type gallium oxide film prepared in Example 3.

| Test items | Example 3 | Example 3 after 30 days | Example 3 after 50 days |
| --- | --- | --- | --- |
| Temperature (K) | 300 | 300 | 300 |
| Conductive type | p | p | p |
| Hole carrier concentration (1/cm$^3$) | 7.79 × 10$^{17}$ | 2.56 × 10$^{17}$ | 2.92 × 10$^{17}$ |
| Hall mobility (cm$^2$/V · s) | 0.072 | 0.195 | 0.165 |
| Electrical resistivity (Ω · cm) | 112 | 125.5 | 129.8 |

FIG. 1 was an X-ray diffraction (XRD) pattern of the Al—N co-doped p-type gallium oxide thin film prepared in Example 3 of the present disclosure.

Figure 2:
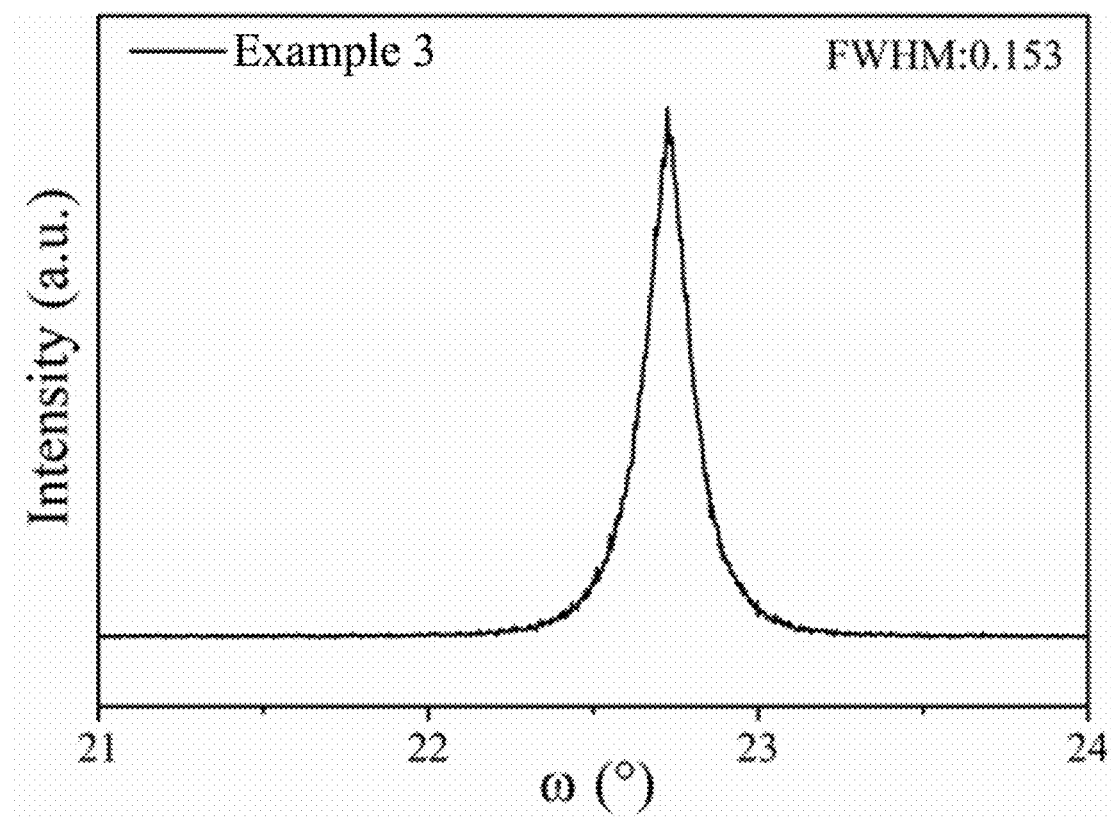
FIG. 2 shows an X-ray diffraction rocking curve of the Al—N co-doped p-type gallium oxide thin film prepared in Example 3 of the present disclosure.

FIG. 2 shows an X-ray diffraction rocking curve pattern of the Al—N co-doped p-type gallium oxide thin film prepared in Example 3 of the present disclosure.

Figure 3:
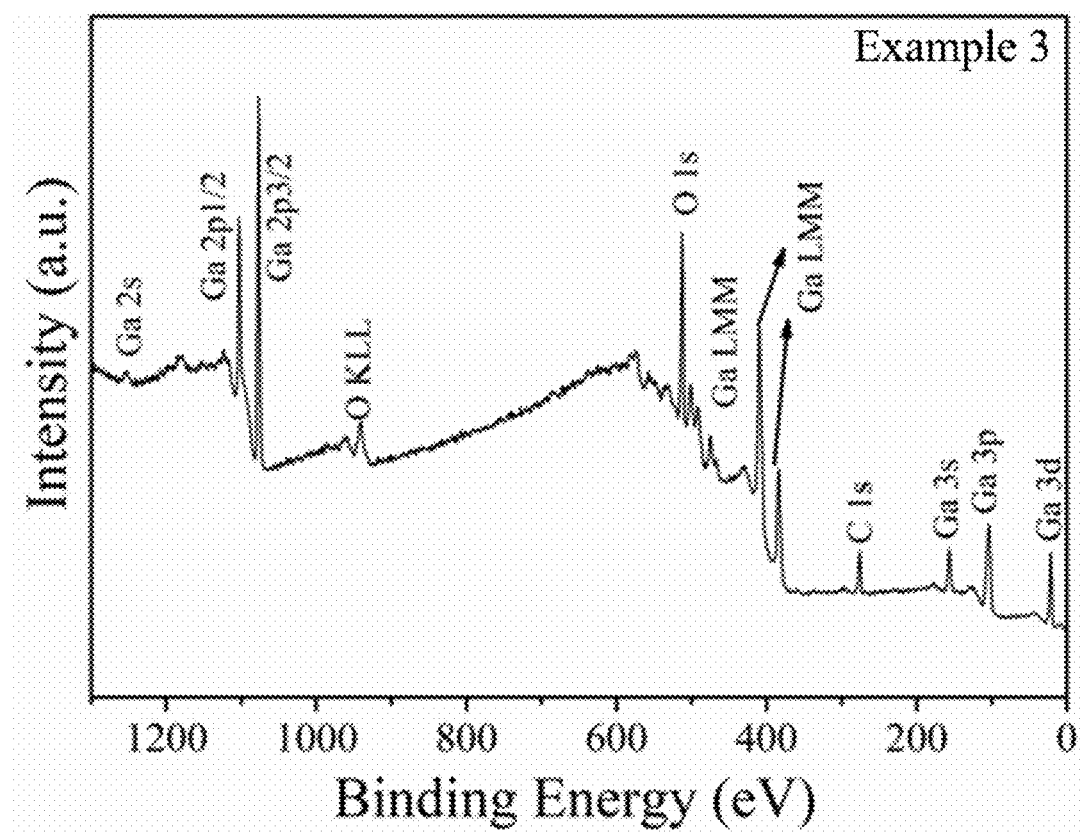
FIG. 3 is an X-ray photoelectron spectroscopy (XPS) spectrum of the Al—N co-doped p-type gallium oxide thin film prepared in Example 3 of the present disclosure.

FIG. 3 was an X-ray photoelectron spectroscopy (XPS) spectrum of the Al—N co-doped p-type gallium oxide thin film prepared in Example 3 of the present disclosure.

Figure 4:
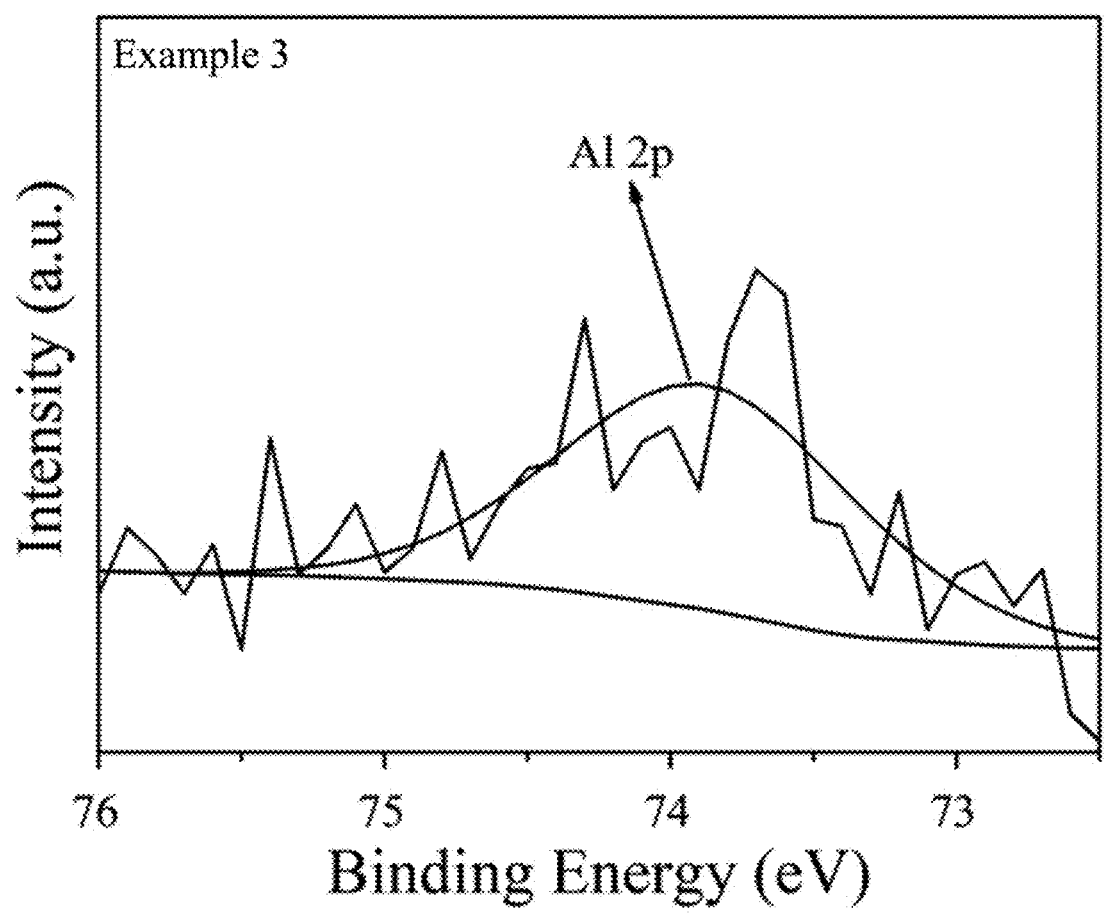
FIG. 4 is an XPS spectrum of an Al 2p photoelectron peak of the Al—N co-doped p-type gallium oxide thin film prepared in Example 3 of the present disclosure.

FIG. 4 was an XPS spectrum of Al 2p photoelectron peak of the Al—N co-doped p-type gallium oxide thin film prepared in Example 3 of the present disclosure.

Figure 5:
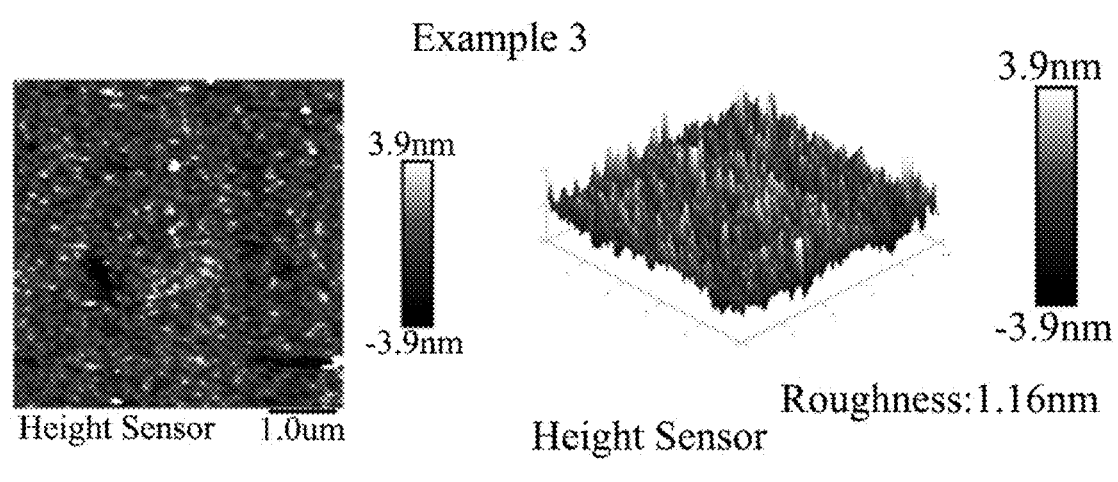
FIG. 5 shows surface topography of the Al—N co-doped p-type gallium oxide thin film prepared in Example 3 of the present disclosure under an atomic force microscope (AFM)

FIG. 5 showed surface topography images of the Al—N co-doped p-type gallium oxide thin film prepared in Example 3 of the present disclosure under an atomic force microscope (AFM).

Figure 6:
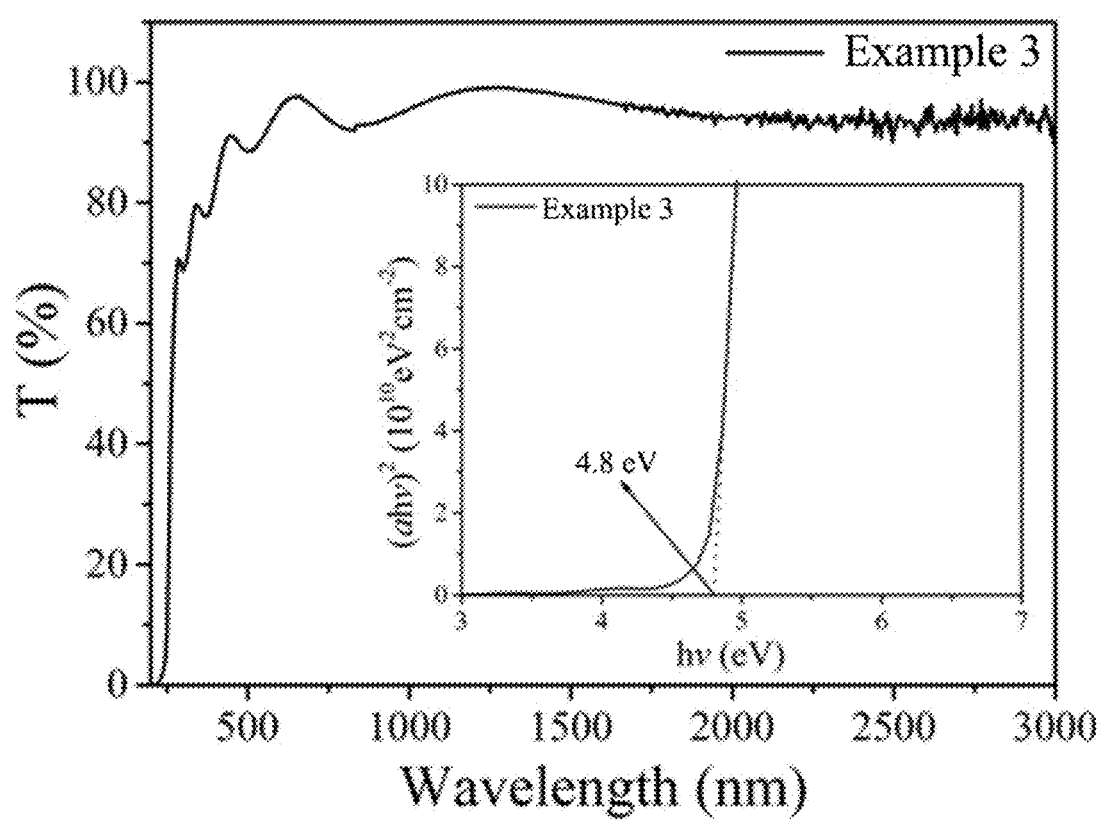
FIG. 6 is a transmission spectrum of the Al—N co-doped p-type gallium oxide thin film prepared in Example 3 of the present disclosure, where an inset shows a curve of $(ahv)^2$ versus hv of the Al—N co-doped p-type gallium oxide thin film.

FIG. 6 was a transmission spectrum of the Al—N co-doped p-type gallium oxide thin film prepared in Example 3 of the present disclosure, where an inset shows a curve of (ahv)$^2$ versus hv of the Al—N co-doped p-type gallium oxide thin film.

Figure 7:
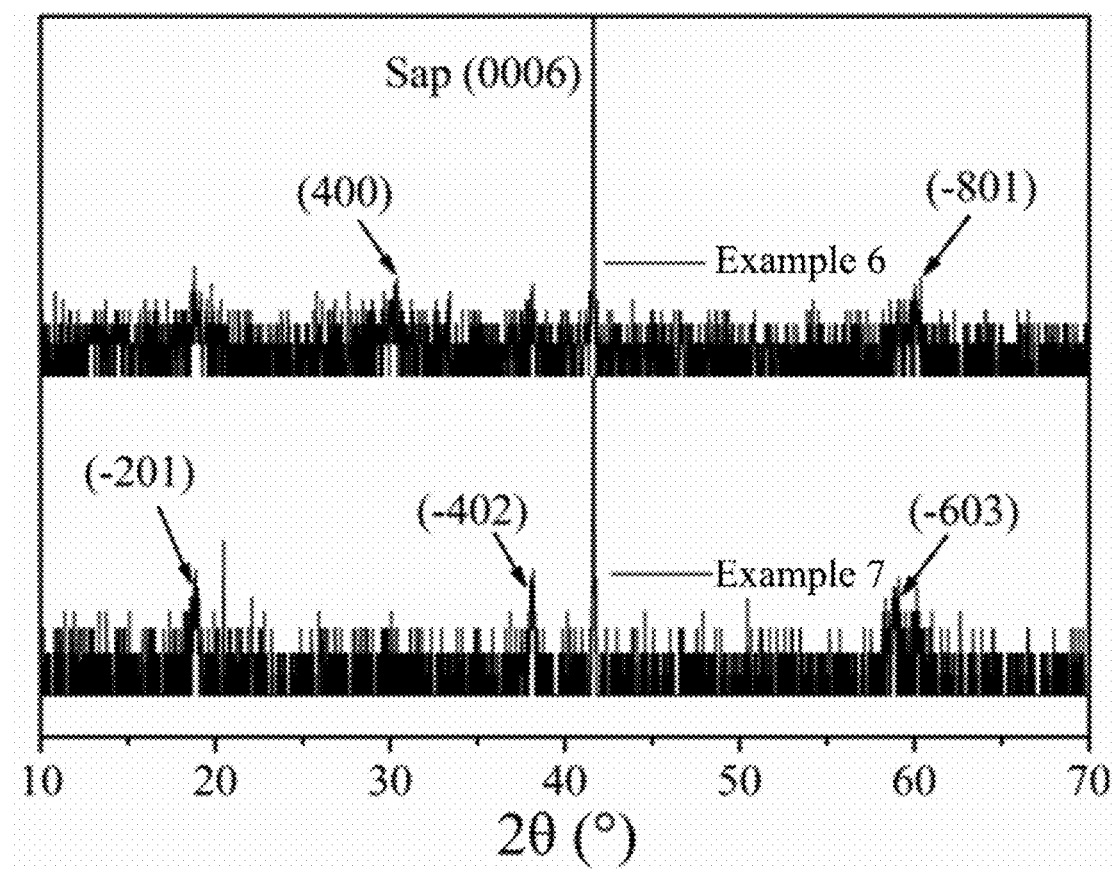
FIG. 7 shows XRD patterns of Sc—N co-doped p-type gallium oxide thin films prepared in Examples 6 and 7 of the present disclosure.

FIG. 7 showed XRD patterns of an Sc—N co-doped p-type gallium oxide thin film prepared in Examples 6 and 7 of the present disclosure.

Figure 8:
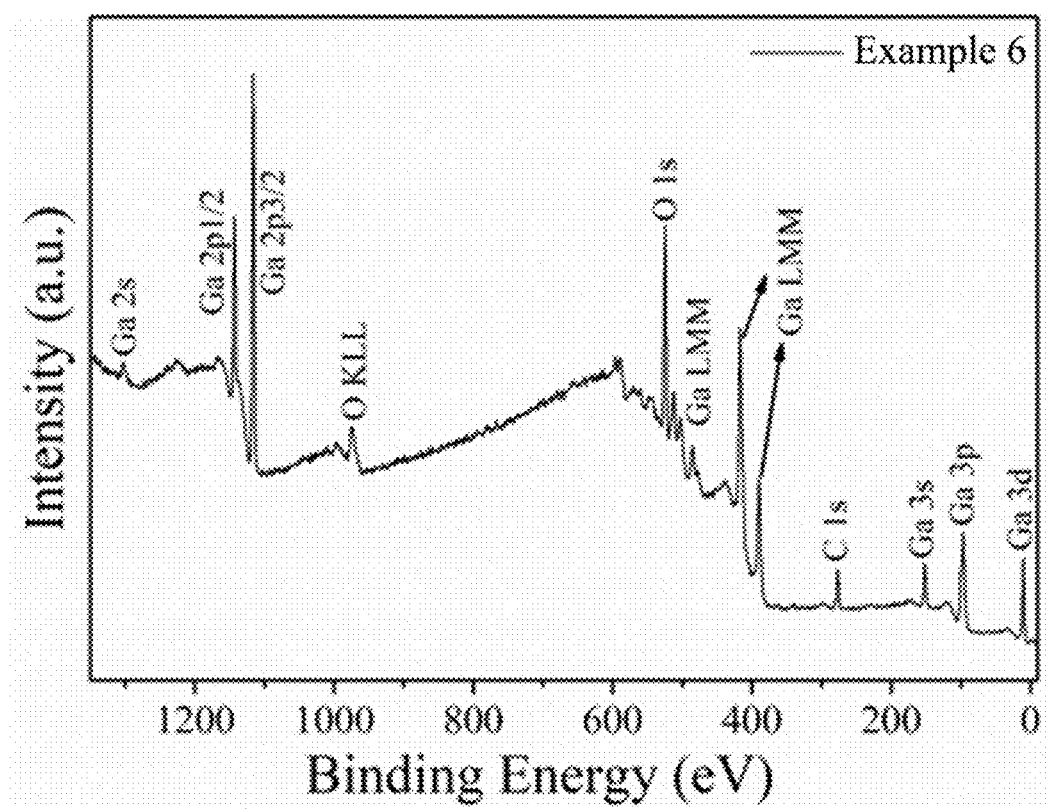
FIG. 8 is an XPS spectrum of the Sc—N co-doped p-type gallium oxide thin film prepared in Example 6 of the present disclosure.

FIG. 8 was an XPS spectrum of the Sc—N co-doped p-type gallium oxide thin film prepared in Example 6 of the present disclosure.

Figure 9:
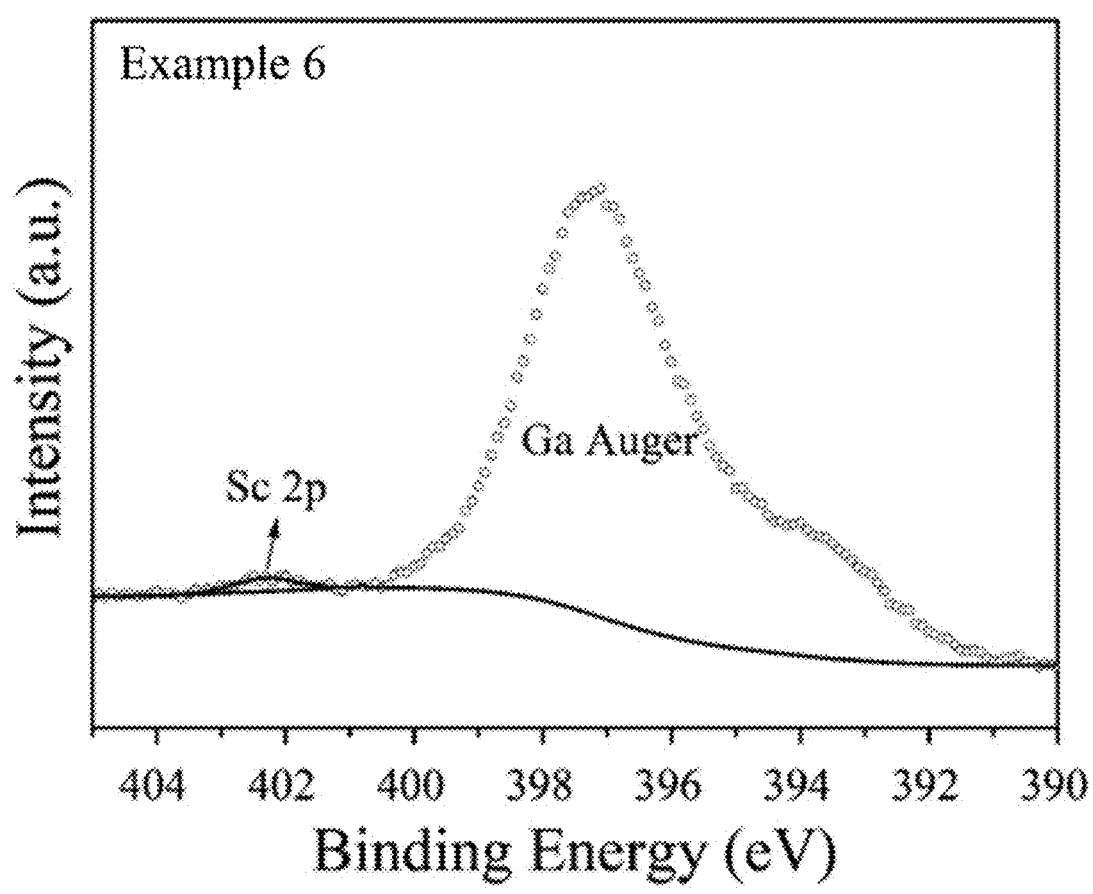
FIG. 9 is an XPS spectrum of Sc 2p photoelectron peak of the Sc—N co-doped p-type gallium oxide thin film prepared in Example 6 of the present disclosure.

FIG. 9 was an XPS spectrum of Sc 2p photoelectron peak of the Sc—N co-doped p-type gallium oxide thin film prepared in Example 6 of the present disclosure.

Figure 10:
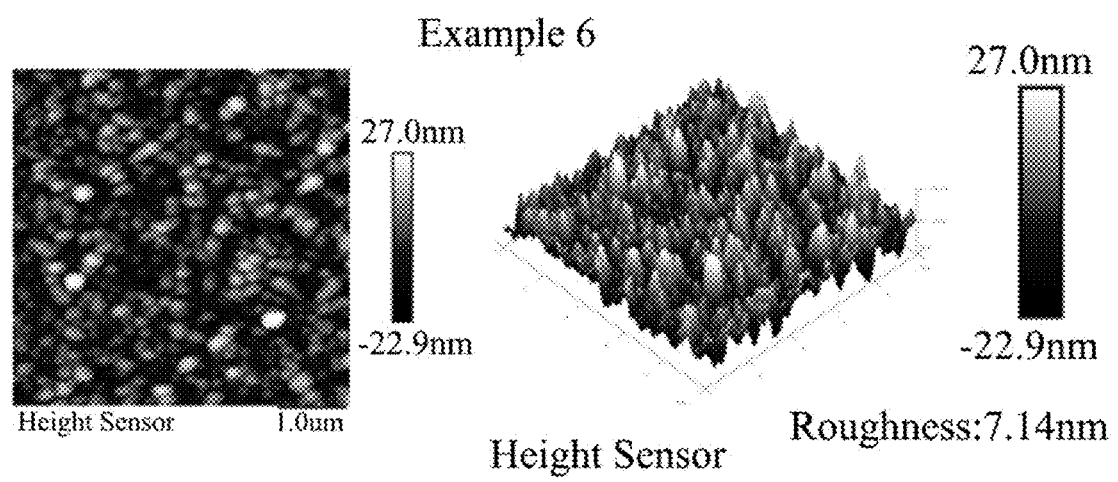
FIG. 10 shows surface topography of the Sc—N co-doped p-type gallium oxide thin film prepared in Example 6 of the present disclosure under the AFM.

FIG. 10 showed surface topography of the Sc—N co-doped p-type gallium oxide thin film prepared in Example 6 of the present disclosure under the AFM.

Figure 11:
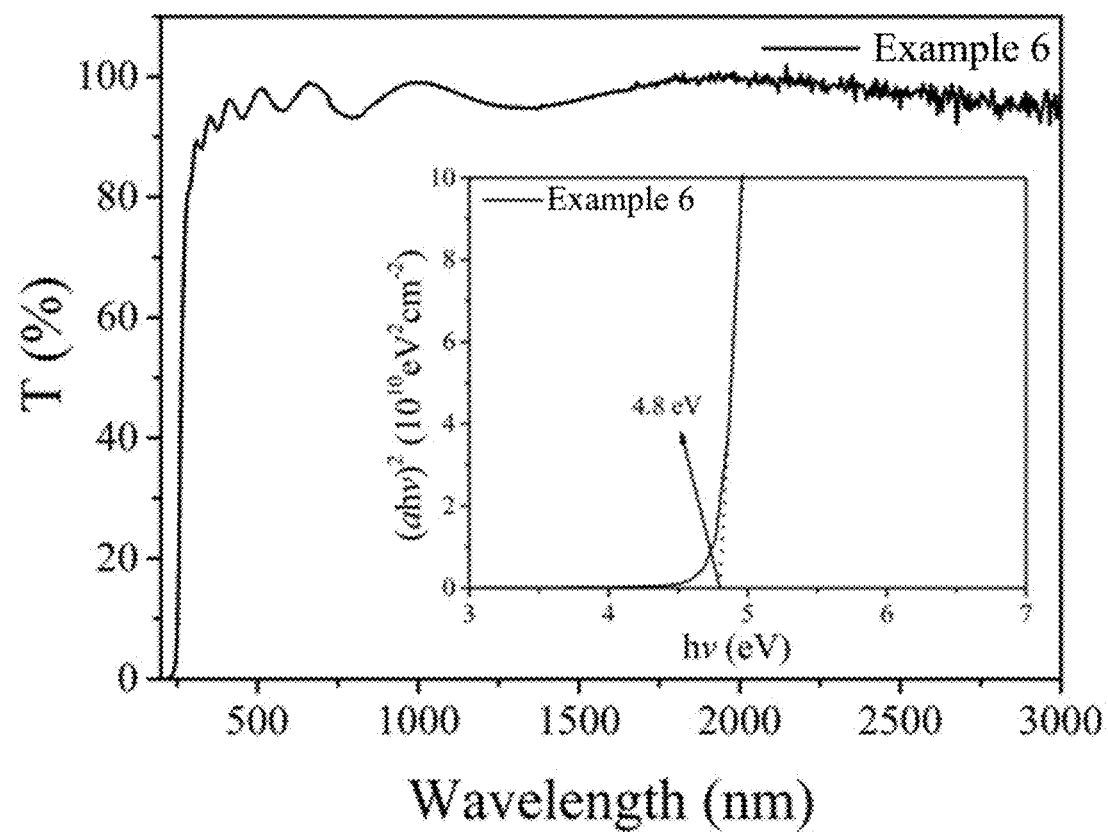
FIG. 11 is a transmission spectrum of the Sc—N co-doped p-type gallium oxide thin film prepared in Example 6 of the present disclosure, where an inset shows a curve of $(ahv)^2$ versus hv of the Sc—N co-doped p-type gallium oxide thin film.

FIG. 11 was a transmission spectrum of the Sc—N co-doped p-type gallium oxide thin film prepared in Example 6 of the present disclosure, where an inset shows a curve of (ahv)$^2$ versus hv of the Sc—N co-doped p-type gallium oxide thin film.

Figure 12:
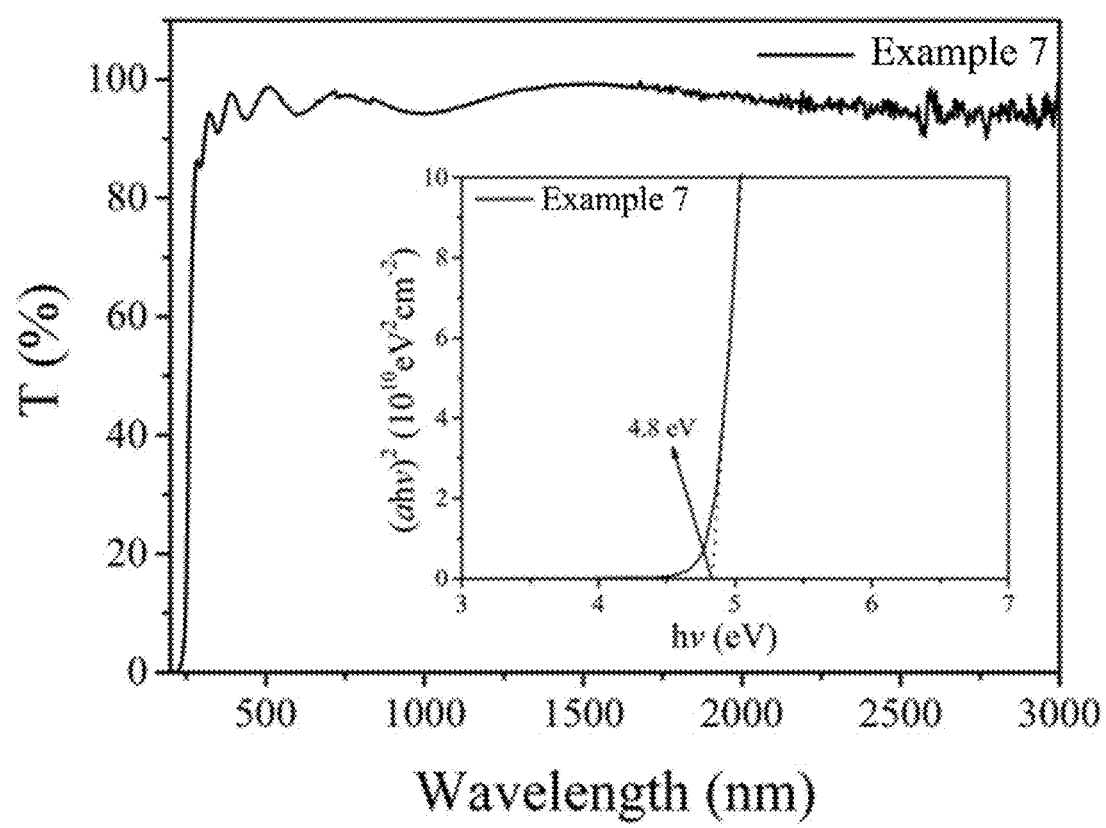
FIG. 12 is a transmission spectrum of the Sc—N co-doped p-type gallium oxide thin film prepared in Example 7 of the present disclosure, where an inset shows a curve of $(ahv)^2$ versus hv of the Sc—N co-doped p-type gallium oxide thin film.

FIG. 12 was a transmission spectrum of the Sc—N co-doped p-type gallium oxide thin film prepared in Example 7 of the present disclosure, where an inset shows a curve of (ahv)$^2$ versus hv of the Sc—N co-doped p-type gallium oxide thin film.

As could be seen from the Hall test results of the films of Examples 3, 6 and 7 in Table 1, by using the method provided in the present disclosure, Al—N or Sc—N co-doped p-type gallium oxide films with good electrical conductivity and high reproducibility were prepared on different substrates (c-plane sapphire, MgO). The Al—N co-doped p-type gallium oxide film grown on the MgO substrate had a high hole carrier concentration of 7.79×10$^{17}$ (1/cm$^3$) and a resistivity of 112 (Ω·cm). The Sc—N co-doped p-type gallium oxide thin film grown on the c-plane sapphire substrate had the highest carrier concentration of 9.56×10$^{16}$ (1/cm$^3$), and the highest hole mobility of 0.11 (cm$^2$/V·s), and the resistivity of 913 (Ω·cm).

From the time-dependent Hall test results of Example 3 in Table 2, the Al—N co-doped p-type gallium oxide thin film prepared by the method provided by the present disclosure was tested as p-type after 30 days, with a hole carrier concentration of 2.56×10$^{17}$ (1/cm$^3$) and a resistivity of 125.5 (Ω·cm), and the film was tested still as p-type after 50 days with a hole carrier concentration of 2.92×10$^{17}$ (1/cm$^3$) and a resistivity of 129.8 (Ω·cm). The time-dependent Hall test results showed that the Al—N co-doped p-type gallium oxide film obtained by the method was stable, and the introduction of Al improves the stability of N acceptors.

As shown in FIGS. 1-6, the (100)-oriented Al—N co-doped p-type gallium oxide film was grown on the MgO substrate, and the full width at half maximum (FWHM) of the rocking curve of the (600) crystal plane of the film was 0.1530, indicating a good crystal quality. The XPS results demonstrated that the film contained only gallium, oxygen, and carbon elements, where the carbon element originated from the adsorbates on the surface of the film, and the film was free of other impurities. The fine-scan spectrum of the Al 2p photoelectron peak showed that aluminum was successfully doped into the gallium oxide film. As observed under an AFM, the surface of the film was smooth, with a roughness as low as 1.16 nm. Optical test results showed that the Al—N co-doped p-type gallium oxide film had a high transmittance (up to 90%) in the wavelength range of 300-3000 nm, and the optical band gap of the film was 4.8 eV.

As shown in FIGS. 7-12, the Sc—N co-doped p-type gallium oxide thin films were successfully grown on a c-plane sapphire substrate. As evidenced by XRD, the Sc—N co-doped p-type gallium oxide thin film prepared in Example 6 was a multi-oriented film, while the Sc—N co-doped p-type gallium oxide thin film prepared in Example 7 was a preferential (−201) oriented film. The XPS spectrum of the Sc—N co-doped p-type gallium oxide thin film prepared in Example 6 showed that the film contained only gallium, oxygen and carbon elements, where the carbon was derived from adsorbates on the surface of the film, and the film did not contain other impurities.

Furthermore, the fine-scan spectrum of the Sc 2p photoelectron peak showed that scandium was successfully doped into the gallium oxide film, and a gallium Auger peak appeared at the binding energy of 397 eV. The AFM images of Example 6 showed that the film surface was smooth, with a roughness of 7.14 nm. The optical test results of Examples 6 and 7 showed that the films had a good transmittance of up to 90% in the wavelength range of 300-3000 nm, and the optical band gap of the films was 4.8 eV.

In summary, by using the method provided in this application, high-quality Al—N co-doped p-type gallium oxide films were grown on the MgO substrates, and Sc—N co-doped p-type gallium oxide films were prepared on the c-plane sapphire substrates. All the Al- or Sc—N co-doped p-type gallium oxide films prepared herein had good optical transmittance, an adjustable thickness, a high p-type reproducibility and a good electrical conductivity. The Al—N co-doped p-type gallium oxide film had a high hole carrier concentration, and was still p-type conductive after 50 days. The introduction of Al improved the solubility of the N acceptors in gallium oxide and the stability of the N acceptors. These results demonstrated significant advantages of the Al- or Sc—N co-doped p-type gallium oxide thin films prepared herein when applied in photodetector devices and power electronic devices.

Described above are only preferred embodiments of the present disclosure, and are not intended to limit the present disclosure. Any modifications, equivalent substitutions, and improvements made within the spirit and principles of the present disclosure shall be included in the scope of the present disclosure defined by the appended claims.

What is claimed is:

1. A method for preparing a p-type gallium oxide film, comprising:
preparing a $M_xGa_{1-x}N$ target material, wherein M is selected from the group consisting of Al, Sc, In, Y and Lu, and $0<x<1$;
preparing a substrate; and
placing the substrate in a vacuum chamber of a deposition apparatus; with the $M_xGa_{1-x}N$ target material as nitrogen source and gallium source, subjecting the $M_xGa_{1-x}N$ target material to ablation, sputtering or thermal evaporation by physical vapor deposition to obtain $M_xGa_{1-x}N$ clusters; and oxidizing the $M_xGa_{1-x}N$ clusters with oxygen to grow a N-doped p-type gallium oxide film on the substrate.

2. The method of claim 1, wherein after placed in the vacuum chamber of the deposition apparatus, the substrate is heated to 400-750° C.

3. The method of claim 1, wherein the physical vapor deposition is performed by magnetron sputtering, pulsed laser deposition, or molecular beam epitaxy; and/or
the substrate is selected from the group consisting of a c-plane sapphire substrate, a magnesium oxide substrate, a gallium oxide substrate, a gallium nitride substrate, a silicon substrate, a Nb-doped $SrTiO_3$ (NSTO) substrate, a quartz glass substrate, an r-plane sapphire substrate and an a-plane sapphire substrate.

4. The method of claim 3, wherein the $M_xGa_{1-x}N$ target material is ablated by the pulsed laser deposition to obtain the $M_xGa_{1-x}N$ clusters, during which the oxygen is fed into the vacuum chamber for growth of the N-doped p-type gallium oxide film, wherein a pressure of the oxygen in the vacuum chamber is adjusted to be 0-5 Pa; a pulsed laser energy is 120-600 mJ; a number of pulses is 6,000-72,000; and a pulse frequency is 1-20 Hz.

5. The method of claim 1, wherein $0.001 \leq x \leq 0.999$.

6. The method of claim 1, wherein the $M_xGa_{1-x}N$ target material is prepared through steps of:
mixing an MN powder and a GaN powder in a preset proportion by ball milling to obtain a mixed powder;
pressing the mixed powder into a ceramic disk; and
sintering the ceramic disk at 800-1200° C. to obtain the $M_xGa_{1-x}N$ target material.

7. The method of claim 6, wherein the mixed powder is pressed at 2-10 MPa to form the ceramic disk with a thickness of 2-5 mm; and the ceramic disk is sintered at 800-1200° C. for 2-5 h to obtain the $M_xGa_{1-x}N$ target material.

8. The method of claim 1, wherein the method further comprises:
before placing the substrate in the vacuum chamber of the deposition apparatus, rinsing the substrate with acetone, anhydrous ethanol, and deionized water in sequence.

9. A p-type gallium oxide film, wherein the p-type gallium oxide film is prepared by the method of claim 1.

10. An application of the p-type gallium oxide film of claim 9 in a preparation of a solar-blind ultraviolet detection device.

11. An application of the p-type gallium oxide film of claim 9 in a preparation of an electronic device.

* * * * *